US011843353B2

(12) United States Patent
Benosman et al.

(10) Patent No.: US 11,843,353 B2
(45) Date of Patent: Dec. 12, 2023

(54) INTERACTIVE ONLINE ADAPTATION FOR DIGITAL PRE-DISTORTION AND POWER AMPLIFIER SYSTEM AUTO-TUNING

(71) Applicant: Mitsubishi Electric Research Laboratories, Inc., Cambridge, MA (US)

(72) Inventors: Mouhacine Benosman, Boston, MA (US); Rui Ma, Carlisle, MA (US); Chouaib Kantana, Paris (FR)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 515 days.

(21) Appl. No.: 17/145,441

(22) Filed: Jan. 11, 2021

(65) Prior Publication Data

US 2022/0200539 A1    Jun. 23, 2022

Related U.S. Application Data

(60) Provisional application No. 63/129,814, filed on Dec. 23, 2020.

(51) Int. Cl.
*H03F 1/32*   (2006.01)
*H03F 3/21*   (2006.01)
*H03F 1/02*   (2006.01)

(52) U.S. Cl.
CPC ......... *H03F 1/3247* (2013.01); *H03F 1/0288* (2013.01); *H03F 3/211* (2013.01); *H03F 2200/451* (2013.01); *H03F 2201/3215* (2013.01)

(58) Field of Classification Search
CPC ....... H03F 1/3247; H03F 1/0288; H03F 3/211
USPC .......................................................... 330/291
See application file for complete search history.

(56) References Cited

U.S. PATENT DOCUMENTS

| 5,650,758 A | * | 7/1997 | Xu ........................ H03F 1/3247 330/149 |
| 6,054,896 A | * | 4/2000 | Wright .................. H03F 1/0294 330/149 |
| 7,058,369 B1 | * | 6/2006 | Wright .................. H03F 1/3294 455/114.2 |

(Continued)

*Primary Examiner* — Patricia T Nguyen
(74) *Attorney, Agent, or Firm* — Gennadiy Vinokur; Hironori Tsukamoto (57) ABSTRACT

An autotuning controller is provided for improving power efficiency and linearity of digital power amplifiers (DPAs). The controller includes an interface including input and output terminals connected to the DPAs, the interface being configured to acquire input signals and output signals, a digital pre-distortion (DPD)-DPA adaptive controller including a processor and a memory running and storing a DPD algorithm, an efficiency enhancement method and a learning cost function. The DPD adaptive controller is configured to perform steps of computing DPD coefficients to define a learning cost function based on a DPD model by use of a data-driven optimization method, wherein the leaning cost function includes both variables of a DDA performance and a DPD performance, updating the learning cost function based on the DPD performance, optimizing the updated learning cost function by solving the updated learning cost function with respect to the variables of the DDA performance, and providing optimal parameters for DPA and DPD via the interface.

20 Claims, 11 Drawing Sheets

(56) References Cited

U.S. PATENT DOCUMENTS

| | | | |
|---|---|---|---|
| 8,706,062 B1* | 4/2014 | Yu | H03F 3/245 455/127.1 |
| 2008/0211576 A1* | 9/2008 | Moffatt | H03F 3/24 330/149 |
| 2017/0077945 A1* | 3/2017 | Pagnanelli | H03F 3/45475 |
| 2019/0131933 A1* | 5/2019 | Ma | H03F 3/265 |

* cited by examiner

INTERACTIVE ONLINE ADAPTATION FOR DIGITAL PRE-DISTORTION AND POWER AMPLIFIER SYSTEM AUTO-TUNING

FIELD OF THE INVENTION

The present invention is related generally to a power amplifier system, and more particularly to a digital Doherty power amplifier system and a learning-based auto-tuning optimization method of a Digital Pre-Distortion (DPD) system and power amplifier system for enhancing performance of radio frequency power amplifier.

BACKGROUND

The rapid growing of wireless communication data volume and rate significantly raise the power consumption in wireless transmitters, in which the power amplifier (PA) is the key component for energy consumption. Several advanced techniques including Envelope Tracking (ET), Doherty Power Amplifier (DPA), Envelop Elimination and Restoration (EER) have been proposed to improve the Power Added Efficiency (PAE) of PA. Among these techniques, DPA is very promising thanks to its simple structure enabling high average efficiency, which is on the basis of active load modulation.

Although the DPA shows numerous advantages for efficiency enhancement, traditional analog DPA still suffers from imperfection which results in a degraded performance in terms of energy efficiency and operational bandwidth. Traditional DPA design is based on single input configuration that contains an analog power splitter (maybe tunable), fixed phase alignment, carrier PA running on class-AB and peak PA running on class-C mode, as well as an output power combiner. To improve DPA efficiency, several methods are studied, including gate bias adaption, asymmetrical DPA, multi-way DPA, tunable phase alignment, and adaptive power splitting ratio.

In order to obtain the optimal Digital Pre-Distortion (DPD) and PA performances, the designer needs to manually tune the circuit operation parameters and the tuning process is only valid for fixed operating conditions such as input power, frequency, and signal standard. While in the practical scenarios, the optimal control parameters do vary with changing inputs and circuit states. The compensation circuit part is also complicated and challenging to optimize, making DPA design cumbersome. These are very limitations from pure analog based design.

There is a need for a more flexible architecture such as digital DPAs (DDPAs) to adaptively find the optimal control parameters for various circuit states and input signals of various bandwidths, modulation formats, power levels and modulation formats. Furthermore, in this invnetion we propose to not only au-tune the parameters of the PA, but also auto-tune the learning cost function of the PA, as function of the DPD perfomance, such that both systems improve their perfroamcnes in synchrony.

SUMMARY OF THE INVENTION

Some embodiments are based on recognition that a Digital Power Amplifier (DPA) is programmable, so that it facilitates circuit tuning procedure (pautotuning) for designer and can take into account on circuit imbalance such as phase delay for multiple paths and environment changes including temperatures. Therefore, the DPA is not only flexible, but also able to provide enhanced performance compared with analog DPAs.

Further, some embodiments of the present invention are based on recognition that an autotuning controller can be provided for improving power efficiency and linearity of digital power amplifiers (DPAs). The autotuning controller may include an interface including input and output terminals connected to the DPAs, the interface being configured to acquire input signals and output signals; a digital pre-distortion (DPD)-DPA adaptive controller including a processor and a memory running and storing a DPD algorithm, an efficiency enhancement method and a learning cost function. The DPD adaptive controller may be configured to perform steps of computing DPD coefficients to define a learning cost function based on a DPD model by use of by a data-driven optimization method, wherein the leaning cost function includes both variables of a DDA performance and a DPD performance; updating the learning cost function based on the DPD performance; optimizing the updated learning cost function by solving the updated learning cost function with respect to the variables of the DDA performance; and providing optimal parameters for DPA and DPD via the interface. In some cases, the providing step may be transmitting variables of the optimized updated learning cost function to the DPAs via the interface.

According to embodiments of the present invention, a DPA system, a Digital Doherty Power Amplifier (DDPA) system, a Digital Pre-Distortion (DPD) and a learning-based auto-tuning method (optimization method) are provided, which particularly improve the efficiency and gain of DPD operating together with PA system by adaptive control meeting linearity requirement at the same time. The DDPA system and the optimization method can be used for broadband mobile communications including 3G, 4G LTE, 5G and beyond base station radio front end of the transmitters.

In some cases, the DDPA system may include the autotuning controller and a Doherty power amplifier (DPA) circuit having control inputs and an output for generating output signals. The autotuning controller may include an interface including input and output terminals connected to the DPAs, the interface being configured to acquire input signals and output signals; a digital pre-distortion (DPD)-DPA adaptive controller including a processor and a memory running and storing a DPD algorithm, an efficiency enhancement method and a learning cost function. The DPD adaptive controller may be configured to perform steps of computing DPD coefficients to define a learning cost function based on a DPD model by use of by a data-driven optimization method, wherein the leaning cost function includes both variables of a DDA performance and a DPD performance; updating the learning cost function based on the DPD performance; optimizing the updated learning cost function by solving the updated learning cost function with respect to the variables of the DDA performance; and providing optimal parameters for DPA and DPD via the interface. In some cases, the providing step may be transmitting variables of the optimized updated learning cost function to the DPAs via the interface.

Some embodiments of the present invention provide a DPD and a Digital Doherty amplifier (DDA) system that fully adaptively find the optimal control parameter set, in-spite of device parameters, environment variances without complicated engineering tunings, where optimal control aims, for example, at high efficiency with reasonable gain in wideband radio transmitter.

One embodiment of the invention is model-free algorithm that does not have assumptions or prior knowledge on DPA devices, where the algorithm is based on black-box optimization to search the optimal configuration, where the optimization learning cost function for the PA is function of the DPD performance.

Some of embodiments not only optimize on DPA efficiency, but also enhance the gain and linearity property in a flexible way, whereas the linearity property term in the learning cost is proportional to the DPD linearization performance. For example, in some embodiments, the system can balance the gain and efficiency trade-off in different bands, or maximize the efficiency under certain constraints. One example is to optimize efficiency while requiring gain greater than configured threshold. In the case of Modulated signal, we optimize Efficiency, Gain along with Adjacent Channel Power Ratio (ACPR) under the same DDPA scenario. ACPR is the important factor in modulated signal to have limited power emitted from main channels to adjacent channels.

According to embodiments of the present invention, a Digital Power Amplifier (DPA) system includes a power amplifier (PA) circuit having control inputs and an output for generating output signals; and an adaptive control circuit comprised of an input interface, an output interface, a memory storing an adaptive control algorithm and a processor performing instructions based on the adaptive control algorithm in connection with the memory, wherein the input interface receives input-state signals and output signals of the PA circuit, wherein the adaptive control algorithm determines, in response to the input-state signals and the output signals, control parameters of control signals transmitted to the control inputs from the output interface for controlling operations of the PA circuit.

BRIEF DESCRIPTION OF THE DRAWINGS

The accompanying drawings, which are included to provide a further understanding of the invention, illustrate embodiments of the invention and together with the description serve to explain the principle of the invention.

DETAILED DESCRIPTION OF THE PREFERRED EMBODIMENTS

Various embodiments of the present invention are described hereafter with reference to the figures. It would be noted that the figures are not drawn to scale and elements of similar structures or functions are represented by like reference numerals throughout the figures. Further, some parts and process steps are indicated by numbers. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

Some embodiments of the present invention are based on recognition that an autotuning controller can be provided for improving power efficiency and linearity of digital power amplifiers (DPAs). The autotuning controller may include an interface including input and output terminals connected to the DPAs, the interface being configured to acquire input signals and output signals; a digital pre-distortion (DPD)-DPA adaptive controller including a processor and a memory running and storing a DPD algorithm, an efficiency enhancement method and a learning cost function. The DPD adaptive controller may be configured to perform steps of computing DPD coefficients to define a learning cost function based on a DPD model by use of by a data-driven optimization method, wherein the leaning cost function includes both variables of a DDA performance and a DPD performance; updating the learning cost function based on the DPD performance; optimizing the updated learning cost function by solving the updated learning cost function with respect to the variables of the DDA performance; and transmitting variables of the optimized updated learning cost function to the DPAs via the interface.

Figure 1:
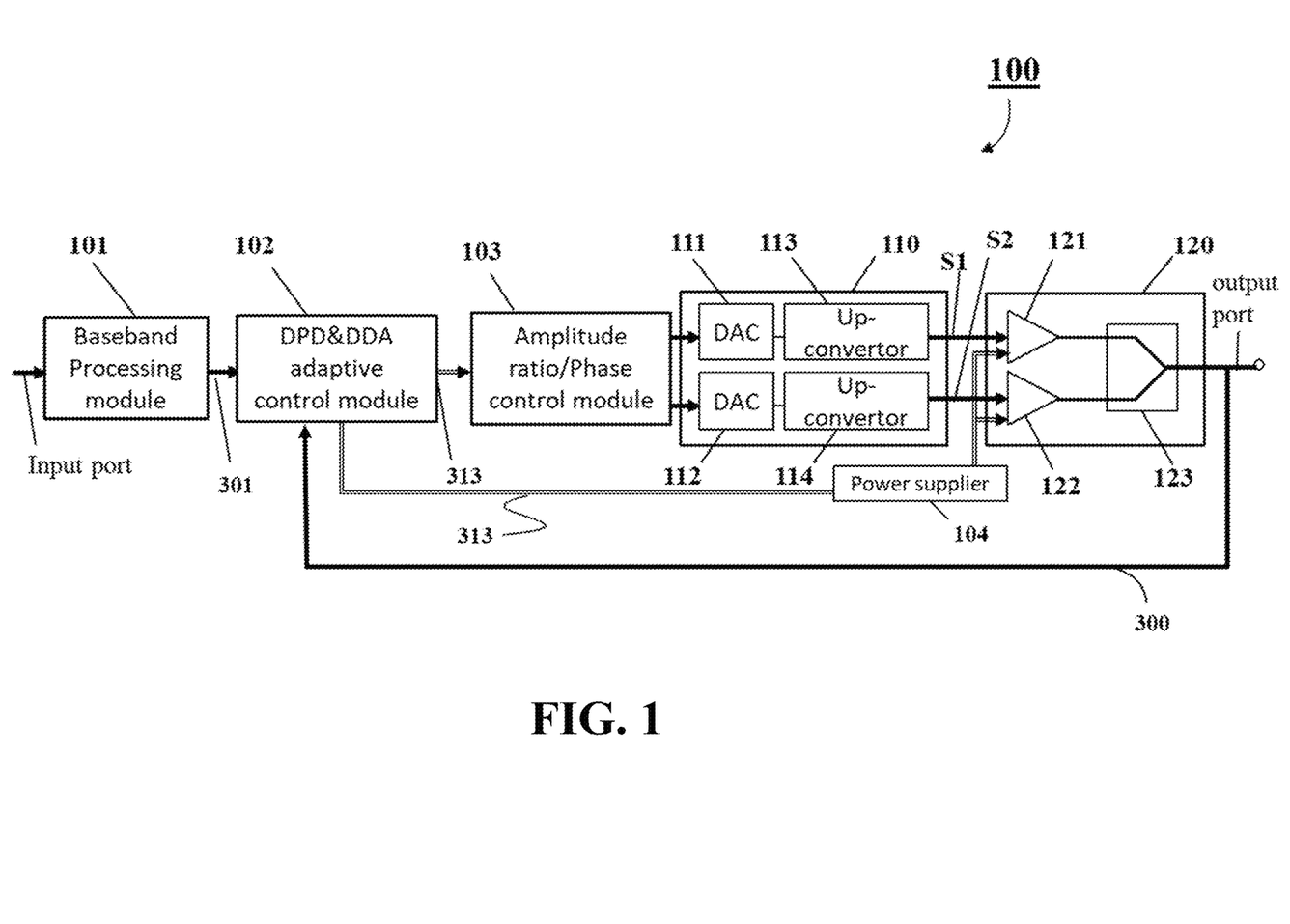
FIG. 1 is a schematic showing a digital power amplifier (DPA), according to embodiments of the present invention.

FIG. 1 is a block diagram of a digital power amplifier (DPA) module (DDPA system) 100, according to some embodiments of the present invention. The DPA module 100 may be a digital power amplifier (DPA) module that is configured by multi-input power amplifiers 120 such as Doherty power amplifiers, out-phasing power amplifiers, balanced power amplifiers and push-pull power amplifiers etc. As an example, Doherty power amplifiers are used in the digital power amplifier (DPA) module 100 to explain the functions of the DPA module. The DPA module 100 may be referred to as a DDPA (Digital Doherty Power Amplifier) module 100. However, it should be noted that the out-phasing power amplifier circuit, the balanced power amplifier circuit or the push-pull power amplifier circuit can also be used depending upon the circuit design variations.

The DDPA module 100 may include a baseband processing module 101, a digital pre-distortion (DPD) & digital Doherty amplifier (DDA) adaptive control module 102, an amplitude ratio/phase control module (Amp-phase module)

103, a signal convertor 110, a dual-input DPA module (DPA module, but not limited to dual inputs) 120 and a power supplier 104 for providing bias conditions (voltage and/or current) to the DPA unit 120 according to optimal control parameters (or control parameters) 313 generated by the DDA adaptive control module 102. The DPA module 120 includes a main PA (carrier PA) 121, a peak PA 122 and an output combiner 123. The signal convertor 110 includes digital-to-analogue convertors (DACs) 111 and 112 and up-convertors 113 and 114. The output and input impedance matching networks of PA are ommited in this figure.

The dual-input DPA 120 includes a carrier power amplifier (PA) 121 for controlling carrier signals and a peak power amplifier (PA) 122 for controlling peak signals, and the output combiner 123 for combining the signals from the carrier and peak PAs 121 and 122. It is obvious that the configuration of digital Doherty can be extended to multiway Doherty, where the more than two PA are involved with similar topologies described in 100.

The DPD&DDA adaptive control module 102 may be referred to as an autotuning controller for improving linearity and power efficiency of digital power amplifiers (DPAs) or a digital adaptive (DA) control module 102 when the power amplifiers other than Doherty amplifiers are used in the module 100, such as outphasing PA and balanced PA. The DPD&DDA adaptive control module 102 includes parts that are not shown in the figures. For instance, the DPD&DDA adaptive control module 102 includes an interface including input and output terminals connected to the DPAs. The interface is configured to acquire input signals from the baseband processing module 101 and output signals from the dual-input DPA 120, and configured to transmit optimal control parameters (optimal control parameter signals) 313 and 104. The autotuning controller 102 further includes a digital pre-distortion (DPD)-DPA adaptive controller. The digital pre-distortion (DPD)-DPA adaptive controller includes a processor and a memory running and storing a DPD algorithm, an efficiency enhancement method and a learning cost function. In this case the DPD adaptive controller is configured to perform steps of computing DPD coefficients to define a learning cost function based on a DPD model by use of by a data-driven optimization method, wherein the leaning cost function includes both of variables of a DDA performance and a DPD performance, updating the learning cost function based on the DPD performance, optimizing the updated learning cost function by solving the updated learning cost function with respect to the variables of the DDA performance, and providing optimal parameters for DPA and DPD via the interface.

The input signals 301 are sent to the DA adaptive control module 102 via the interface. The DA adaptive control module 102 performs the data-driven optimization and generates the optimal control parameters 313 with respect to the phase difference between the PAs 121 and 122 and the input-power ratio for the PAs 121 and 122, using the input signals 301 and output signals 300 from the DPA module 120. In some cases, the control parameters 313 may be referred to as updated DDPA parameters. The updated DDPA parameters 313 are provided to the Amp-phase module 103. Further, the optimization discussed above may be referred to as a learning-based auto-tuning method of the power amplifier system.

In this case, the control parameters 313 include gate bias parameters of the PAs 121 (Vg1) and 122 (Vg2), input signal phase difference between the PAs 121 and 122, and input-power distribution (ratio) for the PAs 121 and 122. Further, the power supplier 104 receives the gate bias parameters from the DDA adaptive control module 102 and applies gate bias voltages to the PAs 121 and 122 according to the gate bias parameters (Vg1, Vg2). When the Amp-phase module 103 receives the phase difference between the PAs 121 and 122 and the input-power ratio for the PAs 121 and 122 from the DDA adaptive control module 102 as part of the control parameters 313, the Amp-phase module 103 generates signals S1 and S2 to be applied to the PA 121 and the PA 122, respectively. In this case, the signals S1 and S2 are formed so that the amplitude ratio of the signals S1 and S2 and the phase difference between the signals S1 and S2 satisfy values indicated by the optimal control parameters 313 computed by the DDA adaptive control module 102.

In some cases, the DDA adaptive control module 102 can include the power supplier 104, and the PAs 121 and 122 can be field-effect-transistors (FETs) fabricated using gallium nitride (GaN) based materials or other different semiconductor device technologies. Further, the PAs 121 and 122 can be bipolar transistors (BPTs). In this case, the gate biases are replaced with base current biases of the bipolar transistors. The BPTs can be formed by GaN based materials or other different semiconductor device technologies.

Output signals of the output combiner 123 (for instance, quarter-wave transmission line can be used as output combining network. Further, other format such as lumped components inductors, capacitor based can also be used to conduct the same combining function) can be transmitted from an antenna (not shown) via a predetermined band pass filter (not shown). In some other cases, the output combining network can be spatial combining, without any physical components or circuits, such as in the case of massive-MIMO phased array used in 5G, for instance as defined in 3GPP standard specifications 3GPP TS 38.104 version 15.2.0 Release 15. Further, the output signals of the output combiner 123 are received (detected) by the input interface (not shown) of the DDA control module 102 to compute the control parameters 313 that control the carrier PA 121 and the peak PA 122, respectively. In some cases, the control parameters 313 may be referred to as tuning parameters.

Each of the carrier and peak PAs 121 and 122 can be controlled by the control parameters 313 indicating gate-bias, phases and input signals power. The phase-signals and input-power signals are applied to the Amp-phase module 103. The Amp-phase module 103 adjusts the amplitude ratio and phases of signals of the carrier and peak PAs 121 and 122 according to the control parameters 313 produced by the DDA adaptive control module 102.

In this case, the signal convertor 110 generates and provides the properly phased-signals and input-power signals to the carrier and peak PAs 121 and 122 via a drive amplifier (not shown) driving the carrier and peak PAs 121 and 122 if necessary.

The DPD & DDA adaptive control module 102 includes a processor (not shown) in connection with one or more memories (not shown) storing the adaptive control algorithm, in which the processor performs instructions according to the predetermined adaptive control algorithm. Further, the adaptive control algorithm is based on a model-free optimization called an adaptive tuning control.

The control parameters 313 are generated by the DDA adaptive control module 102 that computes the values of the control parameters 313 by the adaptive optimization control. In some cases, the control parameters 313 may be referred to as data-driven optimization parameters.

Further, the DDA adaptive control module 102 also includes an input interface (not shown) to receive the input signals 301 and the output signals 300 of the dual-input DPA module 120, and an output interface (not shown) that generates the control parameters 313 that include phase control signals, power-ratio control signals and bias-signals for controlling the dual-input DPA 120 and the carrier and peak PAs 104 and 105.

The DDA adaptive control module 102 receives baseband signals from the baseband processing module 101 and detects output signals 300 of the output combiner 106 via the input interface to produce the control parameters 313, which can be referred to as data-driven optimization parameters 313, based on the adaptive control algorithm. In this case, part of the data-driven optimization parameters 313 is provided to the Amp-phase control module 103 via the output interface for controlling phases and power ratios of the PAs 121 and 122. Further, another part of the data-driven optimization parameters 313 is converted to gate biases respectively supplied to the PAs 121 and 122 via the power supplier 104 for controlling the gate biases of the PAs 121 and 122.

In FIG. 1, the DDPA module 100 is programmable so that it facilitates circuit tuning procedure for designer and can fully take into account on circuit imbalance and imperfections for multiple paths. Therefore, the DDPA module 100 is not only flexible and low cost, but also provide better performance compared with analog DPA. The design according to an embodiment of the present invention benefits from software-designed principle so that the control ports can be adapted to reach the optimal performance through algorithms.

Making an RF power amplifier more efficient means driving it to a point near its point of saturation. In such a case, the modulated waveforms tend to be distorted (introducing nonlinearity characterized by ACPR (Adjacent channel power ratio). Thus, the design goal is to maximize the Power Added Efficiency (PAE), while maintaining high gain and good linearity (ACPR). In some cases, digital linearity can be achieved through Digital Pre-Distortion (DPD).

Figure 2:
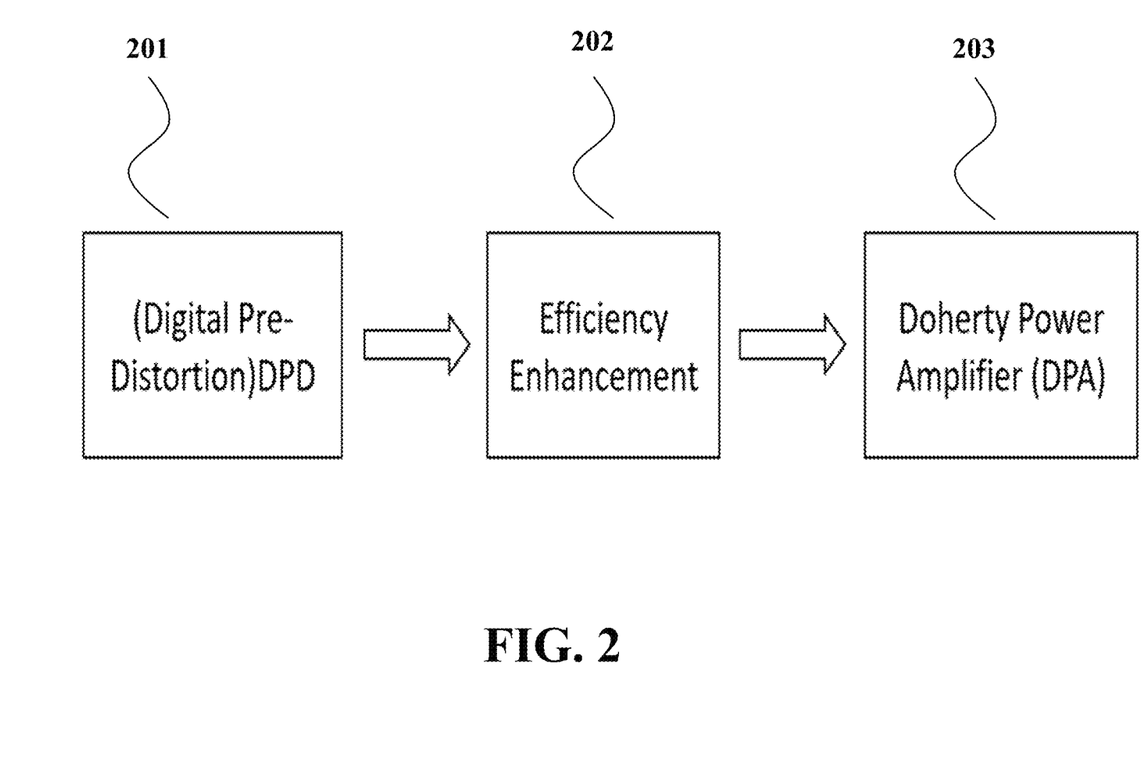
FIG. 2 is a schematic showing the stages in improving linearity and efficiency of the power amplifier through a DPD (Digital Pre-distortion) process, according to embodiments of the present invention.

FIG. 2 shows stages in improving linearity and efficiency of the PAs 121 and 122 through a DPD (Digital Pre-distortion) process 201 and an efficiency enhancement process 202 respectively. In the processes, the digital pre-distortion of input signals is performed in step 201, the efficiency enhancement is performed in step 202, and the input signals obtained by the processes through the digital pre-distortion (DPD) and the efficiency enhancement are provided to the PAs 121 and 121 in step 203.

Figure 3A:
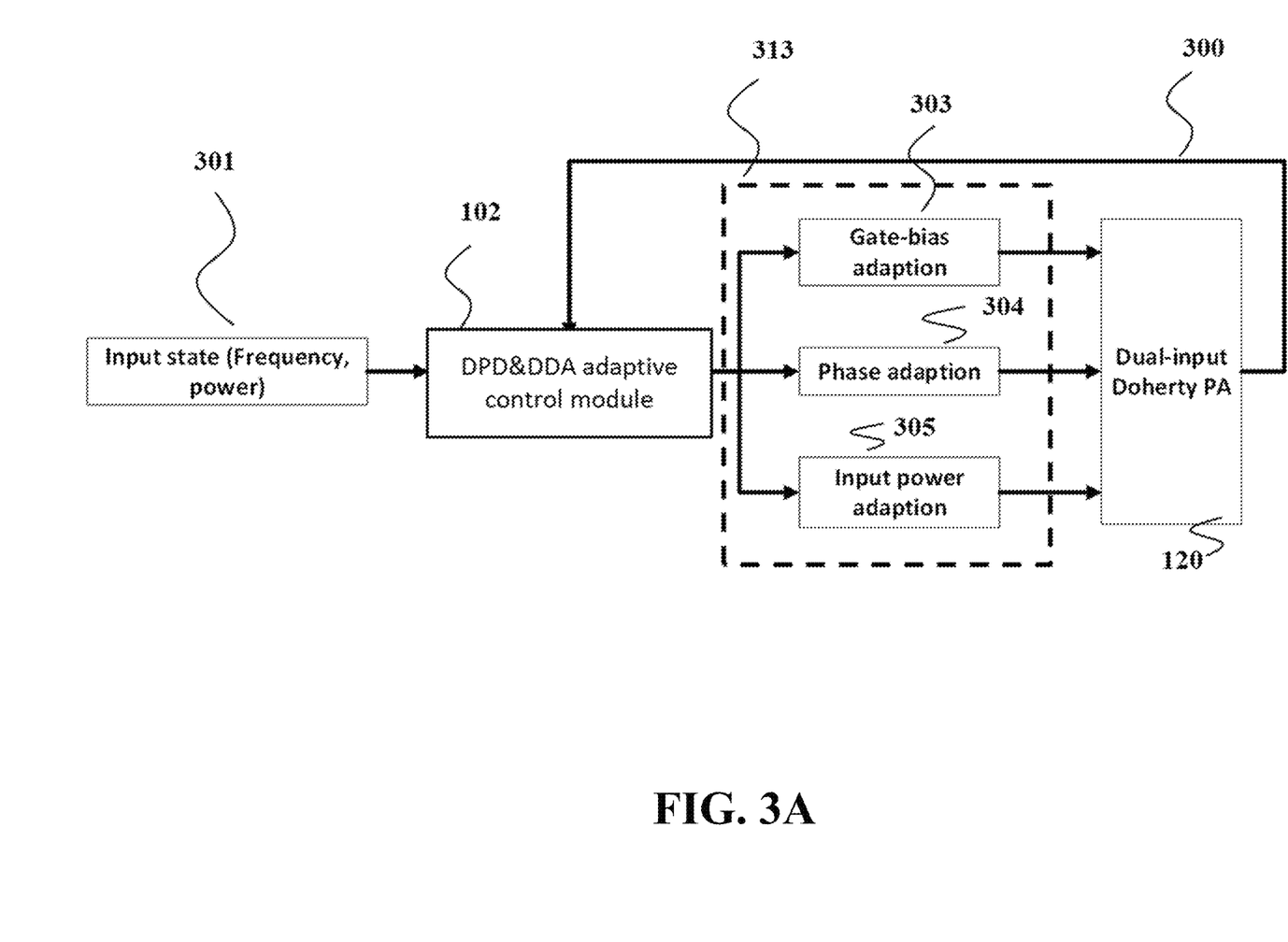
FIG. 3A is a schematic showing a block diagram of the algorithm for PA auto-tuning, according to embodiments of the present invention.

FIG. 3A shows a detailed block diagram of our algorithm for PA auto-tuning where input signals (input state signals) 301 is used as an input state including different states indicating the Frequency and Input power level but not limited to these two states, other states such as signal modulation format can be included as well. The input state signal 301 indicating Frequency and Input signal power level is fed into the DDA adaptive control module 102 to adaptively tune the control parameters 313 of the DDPA 120 such as Gate-bias 303, phase difference 304 between main and peak amplifiers, and input power distribution 305, by using the input signal 301 and the output signal 330 of the dual input DPA module 120. Finally, tuned parameters are fed to the dual input DPA module 120.

According to circuit design variations, the DPA module 120 may include three or more than three power amplifiers (PAs). For instance, see FIG. 3B. In such a case, the DDA adaptive control module 102 provides control parameters 313 for each of the three or more than three power amplifiers.

Figure 3B:
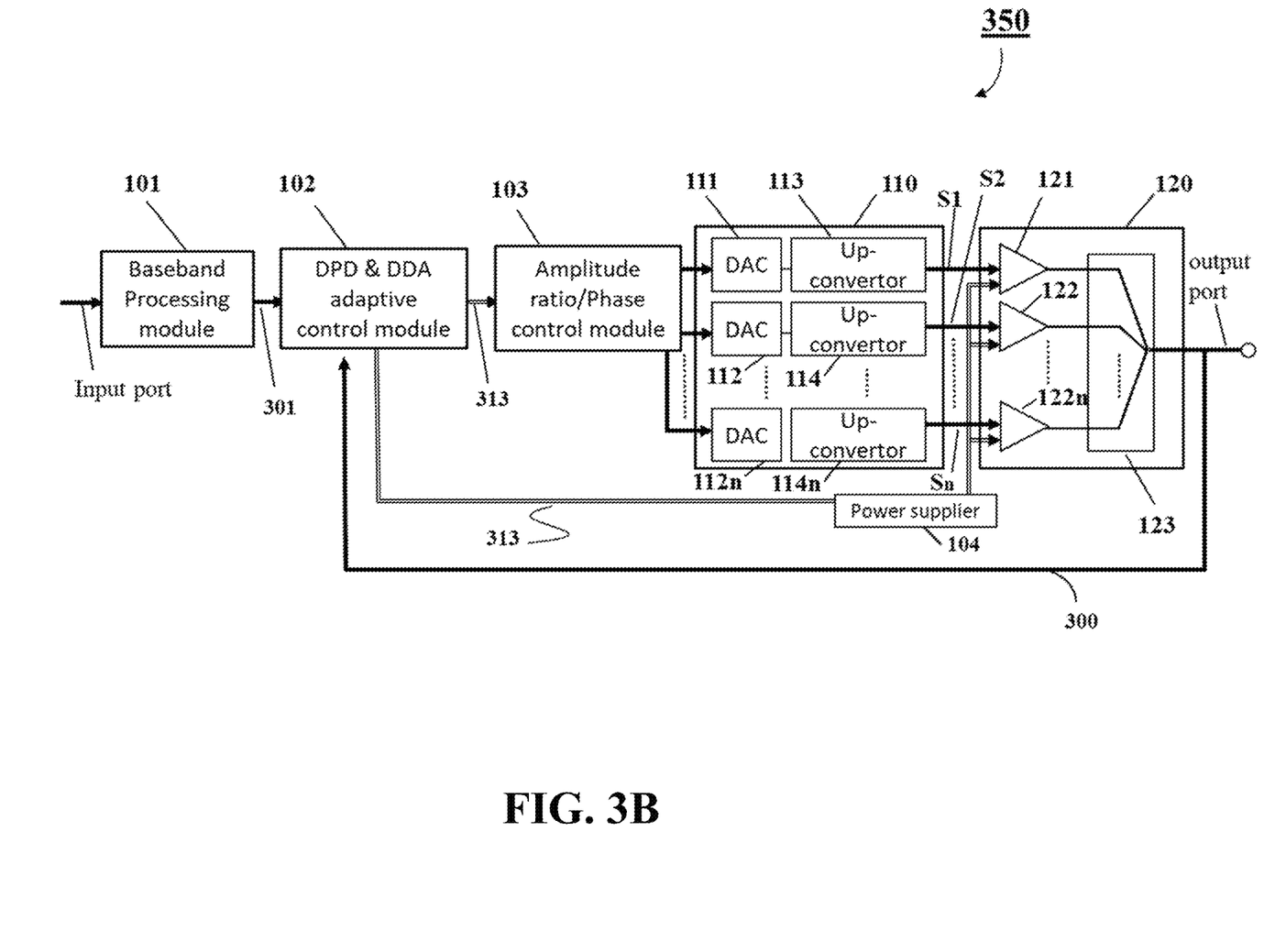
FIG. 3B is a block diagram showing a digital power amplifier (DPA), according to embodiments of the present invention.

FIG. 3B is a block diagram illustrating a multi-input digital power amplifier module 350 that performs an auto-tuning process of a DPA module, according to embodiments of the present invention.

In the figure, identical part numbers in FIG. 1 are used for parts when the functions of the parts are similar to those in FIG. 1. Further, descriptions for the identical part numbers are omitted.

The multi-input digital power amplifier module 350 includes a baseband processing module 101, a DPD & DDA adaptive control module 102, an amplitude ratio/phase control module 103, a signal convertor 110, and a multi-input PA module 120. In this case, the signal convertor 110 includes digital-to-analogue convertors (DACs) 111, 112 and 112n, and up-convertors 113, 114 and 114n.

The multi-input PA module 120 includes a carrier power amplifier (PA) 121 for controlling carrier signals and a peak power amplifier (PA) 122 for controlling peak signals, and a second peak power amplifier (PA) 122n for controlling second peak signals, and an output combiner 123 for combining the signals from the PAs 121, 122 and 122n. In this case, the signal convertor 110 includes three or more than three DACs and three or more than three Up-convertors, and the multi-input PA module 120 includes three or more than three power amplifiers 121, 122 and 122n.

The DA adaptive control module 102 generates updated DPA parameters 313 using the input signals 301 and output signals 300 of the multi-input PA module 120, and provides the updated DPA parameters 313 to the Amp-phase module 103. Then the Amp-phase module 103 provides signals to the signal convertor 110 such that the signal convert generates S1, S2 and S2n to be applied to the PA 121, the PA 122 and PA 122n, respectively.

As described above, the optimal control parameters 313 are computed using the DPD&DDA adaptive control module 102. Detailed discussion regarding the optimal control parameters will be provided below.

Figure 4:
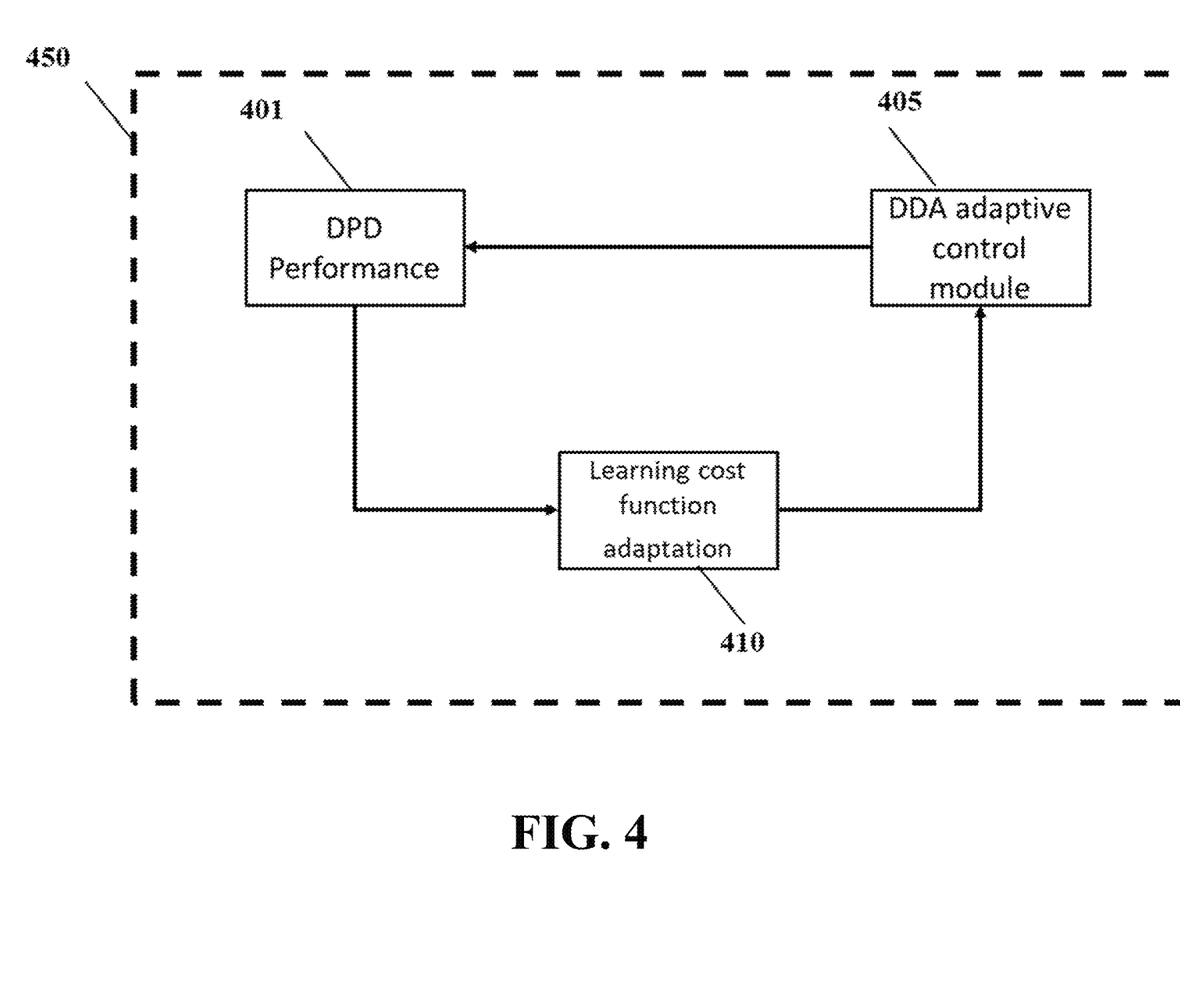
FIG. 4 is a block diagram showing interaction between DPD, DPA and the learning cost update process, according to embodiments of the present invention.

As in FIG. 4, the main embodiment of this invention is the design of an interaction loop 450 between the DPD adaptation and the DDA adaptation, which is performed in the DPD and DDA adaptive control module 102. Part of this interaction loop 450 is based on the adaptation of the learning cost function 410 to the DPD performance 401. The learning cost function is adjusted based on the DPD performance and then it is used to perform adaptive control of the DDA 405 (DDA adaptation 405). the system is coupled, the adaptation of the DDA 405 also influences the DPD performance 401. This loop of mutual influences makes the problem challenging.

Figure 5A:
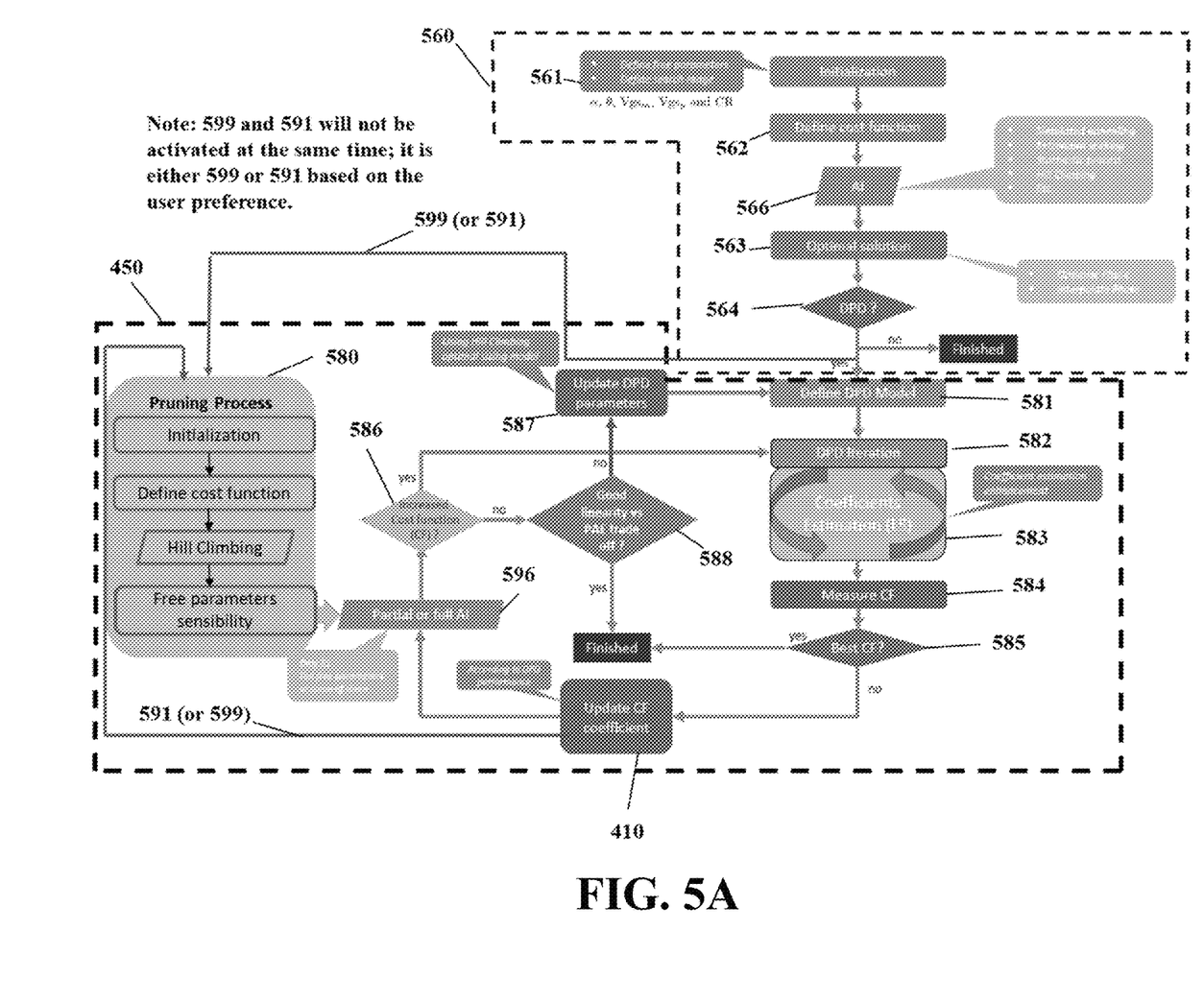
FIG. 5A is a flow chart of a DPD/DPA tuning algorithm, according to embodiments of the present invention.
Figure 5B:
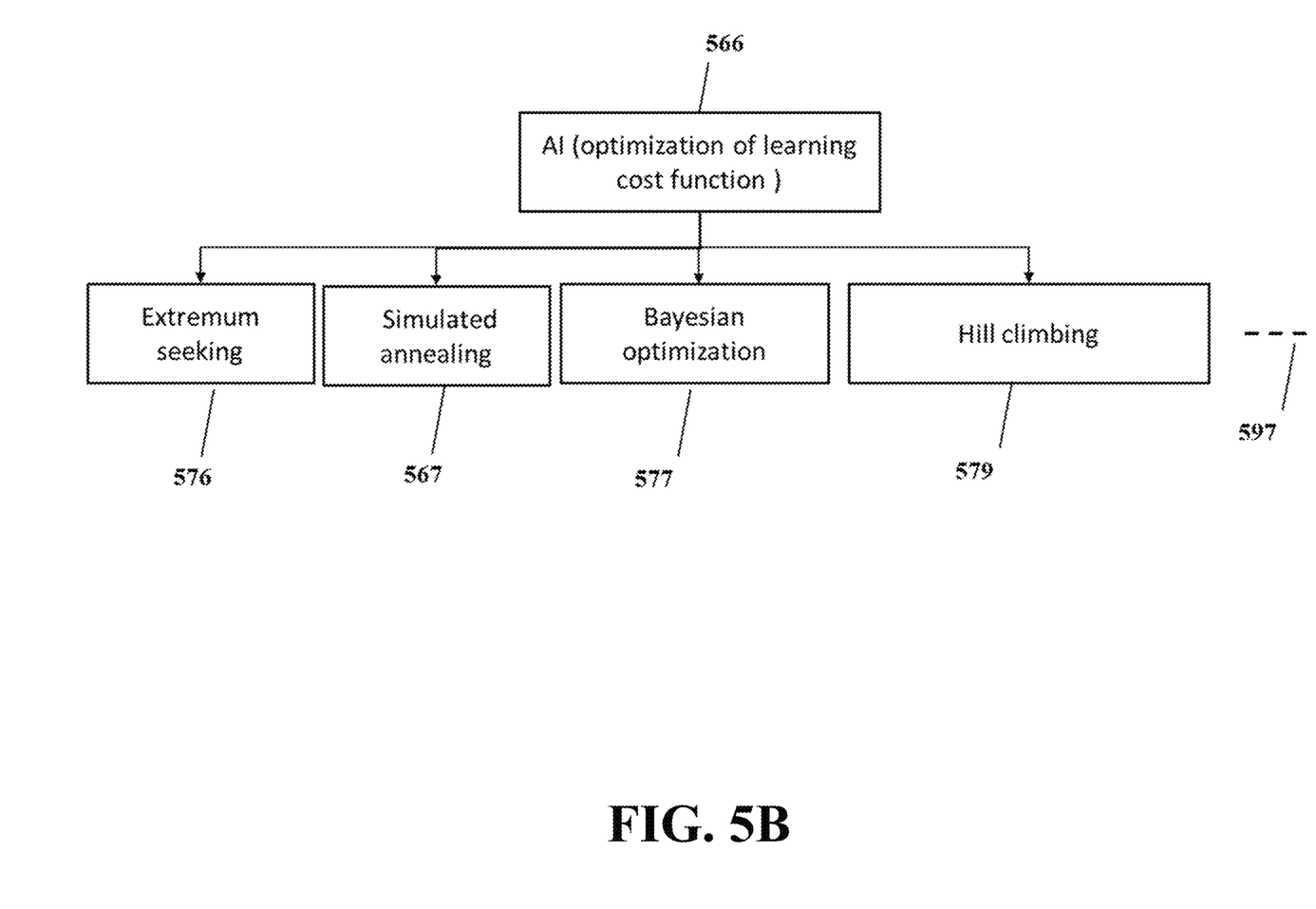
FIG. 5B is a block diagram showing several data-driven optimization used in DPD/DPA tuning algorithm, according to embodiments of the present invention.

As shown in FIG. 5A, in some embodiments of this invention we propose that the interaction loop 450 can be implemented as follows: The systems optimization process starts with a pre-optimization phase 560, where the DDA is adapted separately first. In this pre-optimization phase 560, the optimization variables of the DDA are defined 561, then a partial learning cost function for the DDA only is defined 562. This partial DDA learning cost function is then optimized 563, using a data-driven optimization method 566. As in FIG. 5B, for example one can use extremum seeking methods 576; simulated annealing methods 567; Bayesian optimization 577; hill climbing methods 579, etc 597. After this pre-optimization phase 560, the algorithm checks if the user (an input from a user interface) includes a DPD tuning 564 or not, if no DPD tuning is needed, then the algorithm terminates, if DPD tuning is needed, then the algorithm moves to the next phase, which is the interaction loop 450 between the DPD tuning and the DDA tuning, which constitutes the main embodiment of this invention.

In this DPD-DDA interaction loop, first a DPD model is selected 581. For example, in one embodiment a polynomial model is selected; in another embodiment a nonlinear trigonometric model is elected, yet in another embodiment a deep neural network model if selected as a DPD model. Then the DPD coefficients are computed at the stage of DPD iteration 582, using an optimization method. For example least squares (LS) optimization is used 583. In other embodiments other nonlinear optimization methods can be used at this stage 582. Then the global learning cost function (CF) is measured 584. This global cost function differs from the partial learning cost function 562, in the fact that it included both elements from DDA performance 405 and DPD performance 401. This learning cost function is compared to a desired cost function threshold 584; if the value of learning cost is high enough the algorithm stops, if not the algorithms moves to the learning cost update stage 410.

In this stage, the coefficients of the learning cost are updated 410 based on performance of the DPD 401. This phase will be detailed later in FIG. 6, as one main embodiment of this invention.

Next, the updated learning cost function 410 is optimized 596. This optimization is realized by solving maximizing the updated learning cost function 410 w.r.t. the DDA variables 313. These variables can be defined as:

$$\Theta = [A_{CR,dB} \alpha \phi \Phi_{Att} V_{GS,m} V_{GS,p}] \quad (1)$$

where, $A_{CR,dB}$ is the threshold of PAPR reduction, $\alpha$ is power ratio, $\phi$ is the phase difference, $Phi_{Att}$ is the attenuation difference, $V_{GS,m}$ is the main bias voltage of the power amplifier, and $V_{GS,p}$ is the peak bias voltage of the power amplifier.

However, we realized that this optimization problem can be simplified, by pruning the DDA coefficients that need to be optimized 580. This process 580 can lead to full or partial optimization 596, based on the pruning 580 result. Indeed, if the pruning 580 selects a subset of DDA variables that are the most sensitive in the optimization process, then a partial optimization is solved for 596. If on the other hand, the pruning process 580 founds that all DDA variables are equally important in the optimization, then the full optimization is solved for 596.

In several embodiments of this invention we propose to start the pruning process at different stages of the algorithm. For instance, in one embodiment we propose to start the pruning process 580 after the pre-optimization phase 560, if the user wants to include a DPD tuning 564, then the pruning process 580 is started 599, in parallel with defining a DPD model 581 and the subsequent stages of the algorithm. In another embodiment, we propose to start 591 the pruning process 580 only after the learning cost function has been updated 410. The details of the pruning process are presented later in FIG. 8.

The solution of the optimization 596 leads then to a value of the learning cost function that is either improved, i.e., higher, compared to the value of the cost function in 584, or not. If there is improvement, i.e., higher, of the learning cost function value then the algorithm loops back to DPD optimization iteration 582. If there is not improvement, then the algorithm tests if the performance of the DPD 401 and the DDA performance 405 are within the desired threshold performances set by the user at 588. If yes, the algorithm terminates its learning of best DPD coefficients and DDA coefficients. If no, the DPD model is modified 587, to look for a better DPD model which might lead to improvement of the learning cost function 584.

Figure 5C:
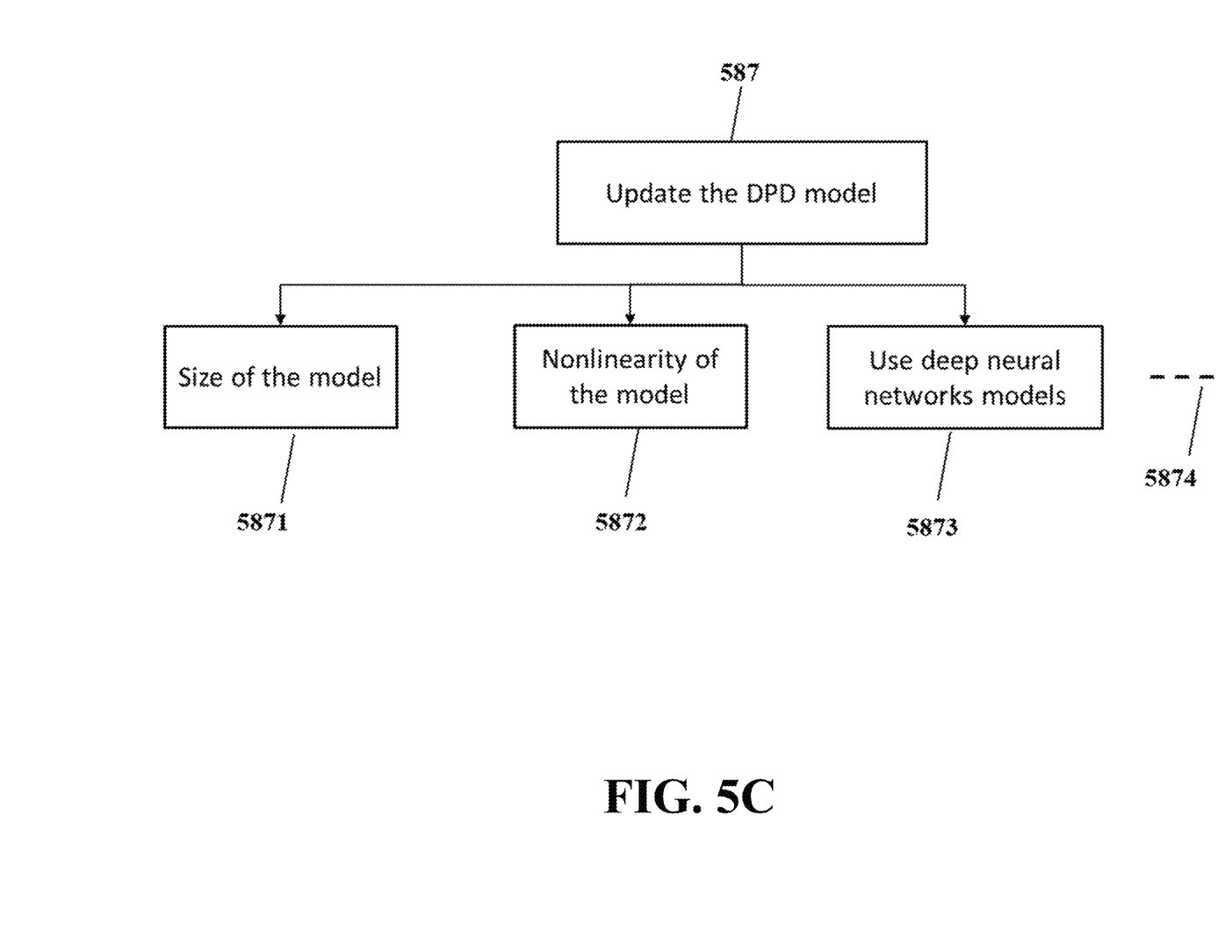
FIG. 5C is a block diagram showing several DPD model choices used in the DPD/DPA tuning algorithms, according to embodiments of the present invention.

The DPD model modification 587 can be done differently for different embodiments of this invention. For example, we can modify the size of the DPD model only 5871. This size modification also known as DPD model resizing can be done using hill climbing methods or other optimization methods. We can also modify the DPD model nonlinearities 5872. For example by implement a trigonometric nonlinearities instead of polynomial nonlinearities. We can also use deep neural networks 5873 to model the DPD, etc. 5874.

Figure 6:
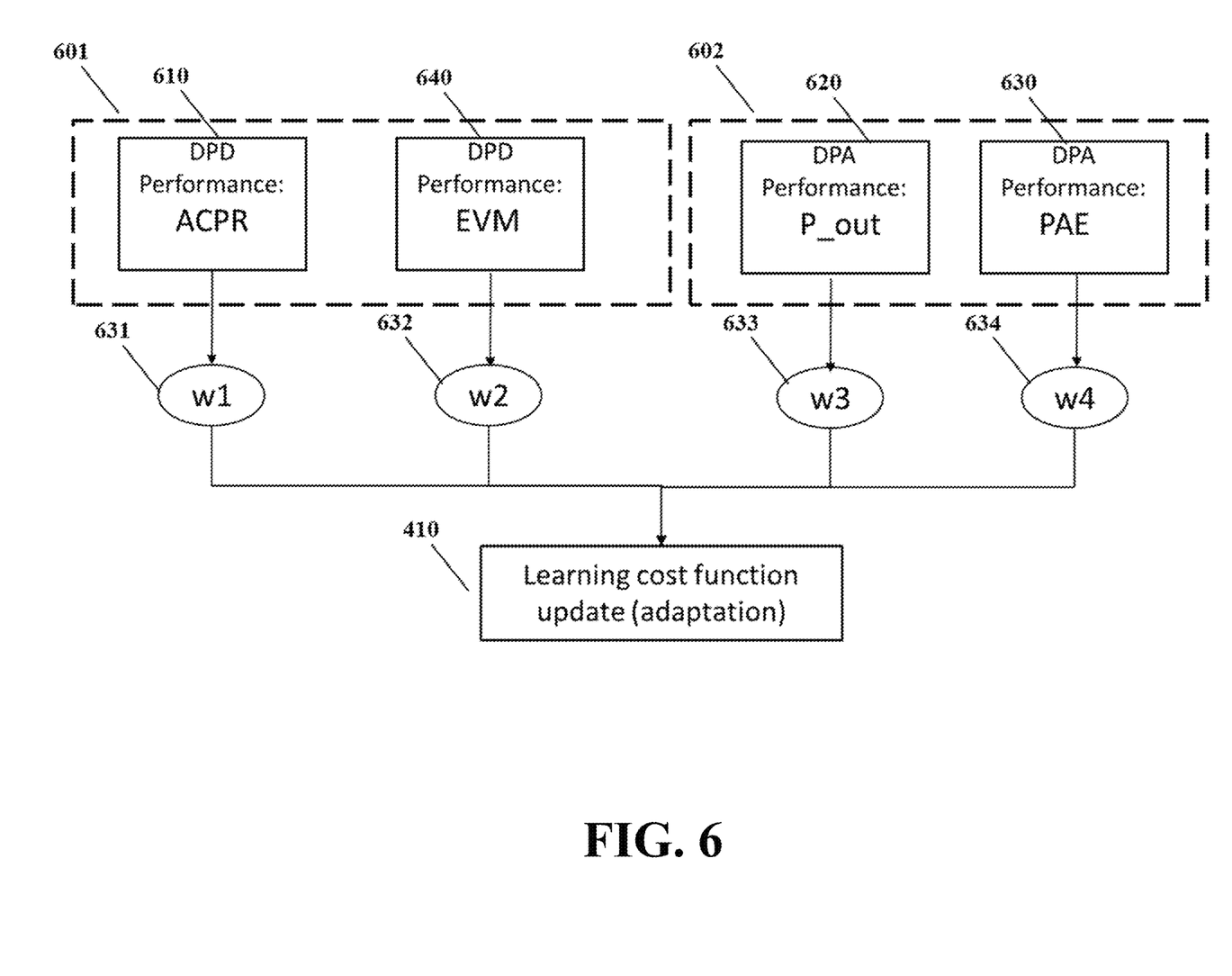
FIG. 6 is a block diagram showing the influence of the DPD and DPA performances on the learning cost function update process, according to embodiments of the present invention.

As in FIG. 6, in one of the embodiments of this invention, we realized that the learning cost 410 can be defined as:

$$J = w_1 \left| \frac{ACPR}{ACPR_t} \right| + w_2 \left| \frac{EVM}{EVM_t} \right| + w_3 \left| \frac{P_{out}}{P_{out,t}} \right| + w_4 \left| \frac{PAE}{PAE_t} \right| \quad (2)$$

where $ACPR_t$, $EVM_t$, and $PAE_t$ are the ACPR target, EVM target, output power target and efficiency target, respectively. Similarly, ACPR, EVM, $P_{out}$ and PAE are the measured ACPR 610, EVM 640, output power 620 and efficiency 630, respectively. $w_1$ 631, is the weigh associated with the first DPD performance ACPR 610, $w_2$ 632 is the weight associated with the second DPD performance EVM 640, $w_3$ 633 is the weight associated with the first DPA power performance 620, and $w_4$ 634 is the weight associated with the second DPA efficiency performance 630.

The objective of our proposed approach is to maximize J 410 to 1 which means that the user specification targets are met. The determining of the weighting coefficient is an important aspect in the design of the learning cost function.

For instance, the equal weights approach attributes an equivalent importance to each objective function. This principle can be used to determine the weighting coefficients if no linearization process will be used in the optimization process. However, DPD significantly improves linearity, which allows us to reduce the weight of the DPD performance 601 of linearity by assuming DPA linearity performance will be improved by DPD. In such case, we want to focus on the DPA performance 602 of power and efficiency On the other hand, applying DPD introduces a back-off in terms of operating power level which dramatically reduces the output power and the power efficiency. Therefore, it has an effect on the cost function which will be deteriorated compared to its value before applying DPD.

Thus, we propose to design an adaptive cost function, in which the weight coefficients are adapted according to the evolution of the optimization process. The update of the weighting coefficients is performed with respect to how much the DPD improve the figures of merit ACPR 610 and EVM 640 compared to the previous iteration.

Figure 7:
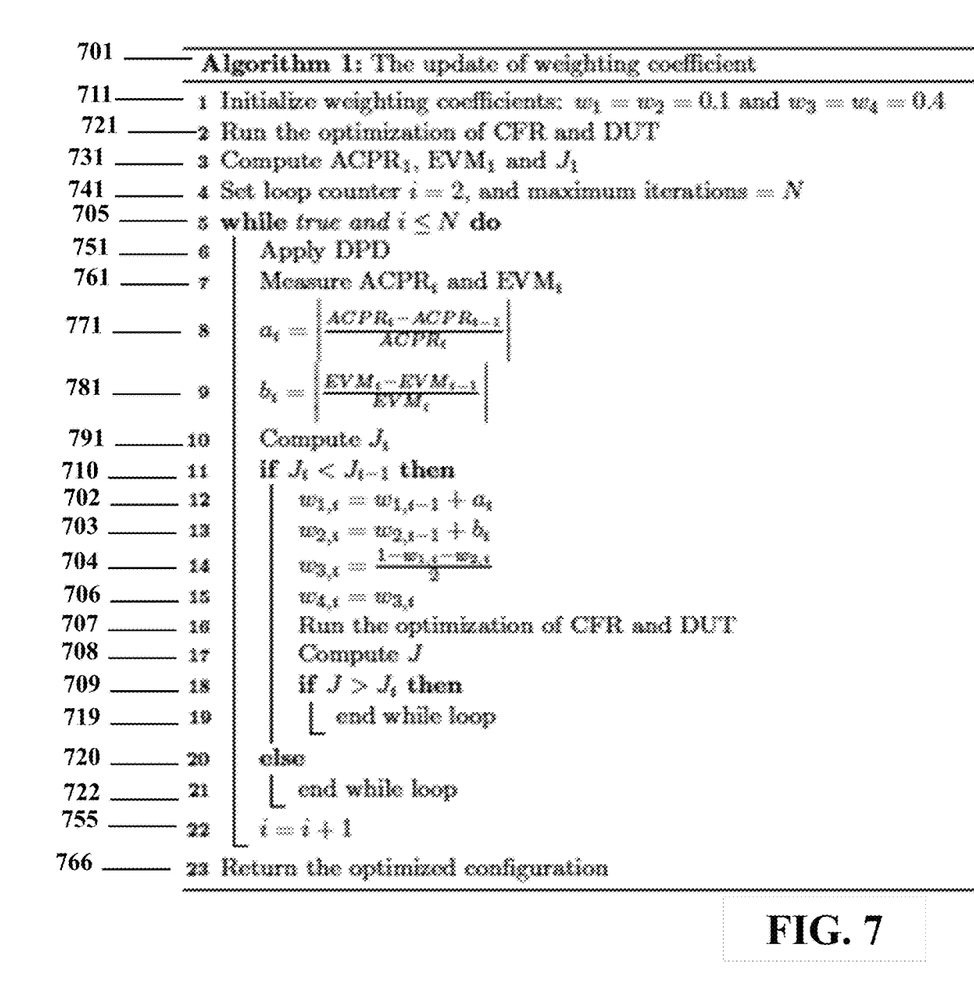
FIG. 7 shows the steps of algorithm for updating the learning cost function, according to embodiments of the present invention.

The update of coefficients $w_i$, i=1, 2, 3, 4, is described in Algorithm 701 as shown in FIG. 7. In one embodiment of the current invention, the weights $w_1$ 631, $w_2$ 632, $w_3$ 633, and $w_4$ 634, are adapted as follows: The weights are initialized to constant values 711, such that their sum is equal to one. The optimization is run 721 to optimize the learning cost function using these constant weights, then the resulting ACPR, EVM and learning cost value J are computed 731. The number of maximum learning iterations is set 731. Then, the DPD is applied to the system, and its performance 601 is measured. The weights adaptation is then performed mainly on $w_1$, $w_2$ by evaluating how far is the DPD performance ACPR 610, and performance EVM 640 away from the desired performance targets $ACPR_t$, and $EVM_t$, then the adaptation value of $w_1$ is given by the ratio of the distance between two consecutive ACPR performances and the target $ACPR_t$ performance 771. Similarly, the adaptation value of $w_2$ is given by the ratio of the distance between two consecutive EVM performances and the target $ECM_t$ performance 781. These adaptation values are then used to adapte $w_1$ 702 and $w_2$ 703. The remaining weights are simply adjusted such that the sum of all weights remains equal to one 704, 706.

Then, the optimization of the learning cost J is done again 707 with the updated weights, and the associated learning cost is obtained 708. If this learning cost value is greater than the previous learning cost at the previous learning iteration 709, then the adaptation algorithm of the weights terminates. If not the learning iteration counter i is incremented 755, and the weights adaptation loop is re-executed 705. The algorithm terminates when the learning cost has improved 710, 709, or when the learning iteration counter has reached his maximum number N.

In another embodiment, we propose to update the weights $w_1$ and $w_2$ as follows:

$$w_{1,i} = w_{1,i} + \|ACPR_{1,i} - ACPR_t\|$$

$$w_{2,i} = w_{2,i} + \|EVM_i - EVM_t\|$$

The remaining weights can then be updated as in 704, 706 to maintain the total weights sum to one.

Yet in another embodiment, we propose to update all the weights as a genera function of the DPD performance 601. For example, we can write the weights as:

$$w_{1,i} = w_{1,i} + f_1(ACPR_i, ACPR_t, EVM_i, EVM_t)$$

$$w_{2,i} = w_{2,i} + f_2(ACPR_i, ACPR_t, EVM_i, EVM_t)$$

$$w_{3,i} = w_{3,i} + f_3(ACPR_i, ACPR_t, EVM_i, EVM_t)$$

$$w_{4,i} = w_{4,i} + f_4(ACPR_i, ACPR_t, EVM_i, EVM_t)$$

Where $f_I$, I=1,2,3,4, are function defined to evaluate the distance between the DPD performances ACPR 610, EVM 640 and the desired performances $ACPR_t$, $EVM_t$.

Figure 8:
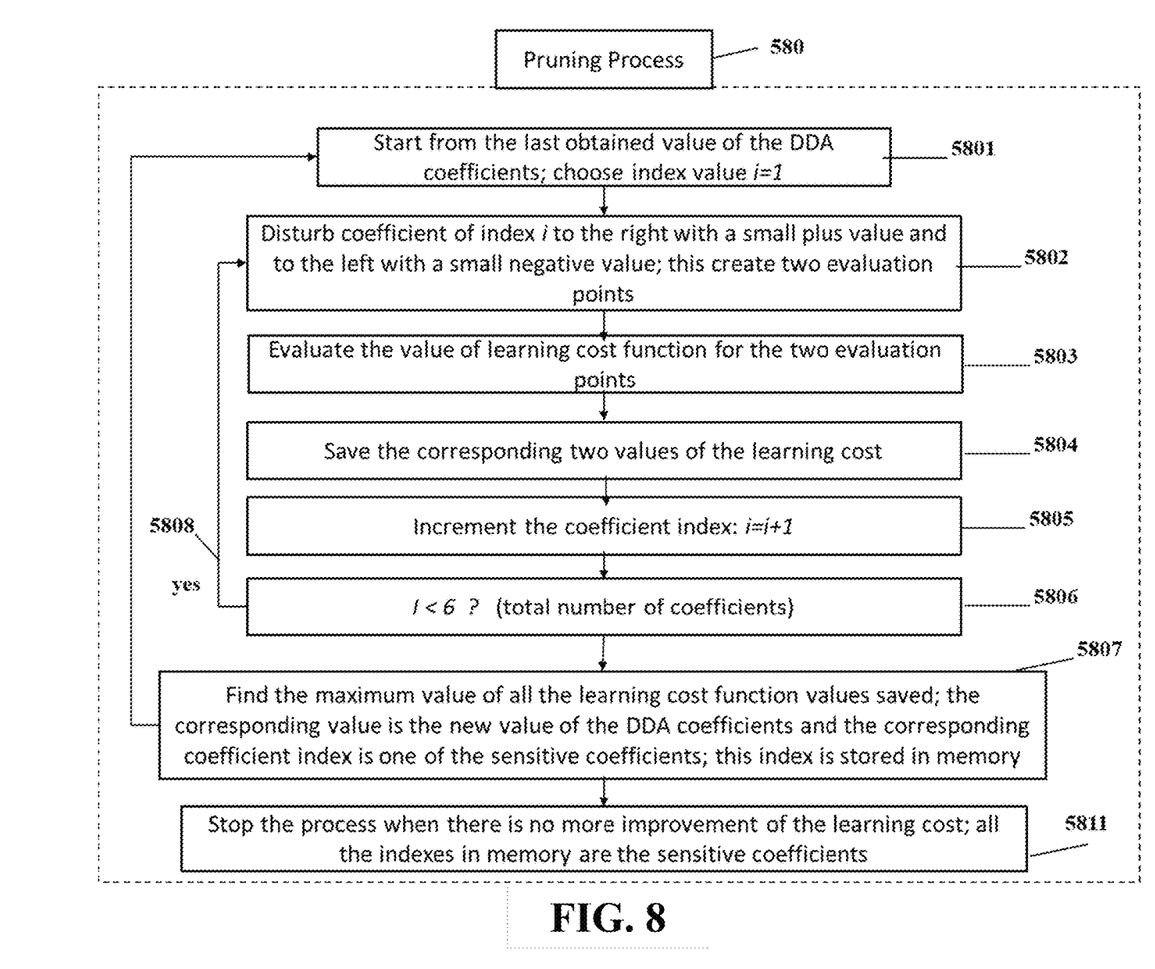
FIG. 8 shows the steps of algorithm for pruning process, according to embodiments of the present invention.

As in FIG. 8, in some embodiments of this invention we propose the following pruning process 580. The pruning process starts from the last obtained value of the coefficients of the DDA 599, 591, and the sensitive coefficients index is initialized to I=1 5801. Then the coefficient of index i is perturbed to its right and left by adding and substring a small exploration value 5802. This exploration 5802 leads to two new values for the DDA coefficients, for which the learning cost is evaluated 5803. The obtained values for the learning cost are then saved in memory 5804. The DDA coefficients index is then increased by one 5805. If the new index is less than the total number of DDA coefficients which is equal to 6, then the algorithm loops back to disturbing the value of the DDA coefficient by adding and subtracting a small exploration value to the new index of the DDA coefficients value 5802. If the index is equal to the total number of DDA coefficients which is equal to 6, then the maximum value of all the learning cost function values saved is obtained, and the corresponding value is the new value of the DDA coefficients and the corresponding coefficient index is one of the sensitive coefficients which is then this stored in memory 5807. Then the pruning process continues by using the new value of the DDA coefficients, and re-initializing the index to i=1. The pruning process continues until there is no more improvement of the learning cost. Finally, all the indexes found stored in memory are the sensitive coefficients of the DDA coefficients 5811.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

The invention claimed is:

1. An autotuning controller for improving power efficiency and linearity of digital power amplifiers (DPAs), comprising:
   an interface including input and output terminals connected to the DPAs, the interface being configured to acquire input signals and output signals;
   a digital pre-distortion (DPD)-DPA adaptive controller including a processor and a memory running and storing a DPD algorithm, an efficiency enhancement method and a learning cost function, the DPD adaptive controller is configured to perform steps of:
   computing DPD coefficients to define a learning cost function based on a DPD model by use of a data-driven optimization method, wherein the leaning cost function includes both of variables of a DDA performance and a DPD performance;
   updating the learning cost function based on the DPD performance;
   optimizing the updated learning cost function by solving the updated learning cost function with respect to the variables of the DDA performance; and
   providing optimal parameters for DPA and DPD via the interface.

2. The autotuning controller of claim 1, wherein the learning const function is defined based on sensitivities of the variables of the DDA performance and the DPD performance.

3. The autotuning controller of claim 1, wherein the learning const function is defined by a threshold of PAPR reduction, a power ratio, a phase difference, an attenuation difference, a main bias voltage of the power amplifier, and a peak bias voltage of the power amplifier.

4. The autotuning controller of claim 1, wherein the data-driven optimization method is an extremum seeking method, a simulated annealing method, Bayesian optimization, genetic evolution or a hill climbing method.

5. The autotuning controller of claim 1, wherein the updating of the learning cost function in real-time based on the DPD performance.

6. The autotuning controller of claim 1, wherein in response to a request from a user, a pruning of the DPA coefficients is performed for fast learning.

7. The autotuning controller of claim 1, wherein if a value of the learning cost function is equal to or higher than a value of a desired cost function, the updating is avoided.

8. The autotuning controller of claim 1, wherein the learning cost function is adapted in an interaction loop that includes the DPD adaptation and the DDA adaptation.

9. The autotuning controller of claim 8, wherein the DDA is adapted separately first to define variables of the DDA.

10. The autotuning controller of claim 1, wherein the DPA and DPD adaptations are performed simultaneously in real-time.

11. A Digital Doherty Power-Amplifier (DDPA) system comprising:
an autotuning controller of claim 1; and
a Doherty power amplifier (DPA) circuit having control inputs and an output for generating output signals.

12. The DDPA system of claim 11, wherein the offline training performed from prior optimal points.

13. The DDPA system of claim 11, wherein the optimization variables include threshold of peak to average power ratio reduction (PAPR), a power ratio, a phase difference, an attenuation difference, a main bias voltage of the PAs, a peak bias voltage of the PAs.

14. The DDPA system of claim 11, wherein the offline training is performed by Adam method, a gradient descent, or a stochastic gradient descent method.

15. The DDPA system of claim 11, wherein the input signal conditions include at least frequencies, signal power levels, and signal modulation formats of PAs.

16. The DDPA system of claim 11, wherein the neural network is a convolutional neural network (CNN), a deep neural network (DNN) or a robust DNN.

17. The DDPA system of claim 11, wherein the trained DDA-DPD NN has been offline-trained based on both the input signal conditions and the optimized DPD and DDA coefficients.

18. The DDPA system of claim 11, wherein the predetermined optimization method is an extremum seeking optimization, a simulated annealing, Bayesian optimization, a hill climbing, genetic evolution or a least squares method.

19. The DDPA system of claim 11, where the DDA-DPD NN obtained for one DDA unit can be transferred to a different DDA unit, where the transfer is done by finite-tuning the DDA-DPD NN using sparse data from the new DDA unit.

20. The DDPA system of claim 11, wherein the interface is configured to connect to at least two power transistors.

* * * * *